(12) United States Patent
Akatsu et al.

(10) Patent No.: US 6,967,136 B2
(45) Date of Patent: Nov. 22, 2005

(54) METHOD AND STRUCTURE FOR IMPROVED TRENCH PROCESSING

(75) Inventors: Hiroyuki Akatsu, Yorktown Heights, NY (US); Kangguo Cheng, Beacon, NY (US); Kenneth Settlemyer, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,594

(22) Filed: Aug. 1, 2003

(65) Prior Publication Data

US 2005/0026382 A1    Feb. 3, 2005

(51) Int. Cl.$^7$ .......................................... H01L 21/8242
(52) U.S. Cl. ...................... 438/243; 438/270; 438/386; 438/387
(58) Field of Search ................... 438/389, 248, 438/391, 245, 246, 388, 386, 243, 270, 387

(56) References Cited

U.S. PATENT DOCUMENTS

| | | | | |
|---|---|---|---|---|
| 5,482,883 | A | | 1/1996 | Rajeevakumar ............... 437/52 |
| 5,930,107 | A | * | 7/1999 | Rajeevakumar .......... 361/321.4 |
| 6,180,480 | B1 | * | 1/2001 | Economikos et al. ....... 438/386 |
| 6,190,988 | B1 | * | 2/2001 | Furukawa et al. .......... 438/386 |
| 6,359,300 | B1 | * | 3/2002 | Economikos et al. ....... 257/301 |
| 6,362,040 | B1 | * | 3/2002 | Tews et al. ................. 438/246 |
| 6,426,254 | B2 | * | 7/2002 | Kudelka et al. ............ 438/246 |
| 6,599,798 | B2 | * | 7/2003 | Tews et al. ................. 438/249 |
| 6,660,582 | B2 | * | 12/2003 | Birner et al. ............... 438/245 |
| 6,716,696 | B2 | * | 4/2004 | Chen et al. ................. 438/243 |
| 6,723,611 | B2 | * | 4/2004 | Akatsu et al. .............. 438/386 |
| 6,762,099 | B1 | * | 7/2004 | Yu-Sheng et al. .......... 438/270 |
| 6,767,786 | B1 | * | 7/2004 | Lin et al. .................... 438/243 |
| 6,872,620 | B2 | * | 3/2005 | Chidambarrao et al. .... 438/243 |
| 6,905,944 | B2 | * | 6/2005 | Chudzik et al. ............ 438/435 |
| 2003/0045052 | A1 | * | 3/2003 | Birner et al. ............... 438/243 |
| 2003/0194867 | A1 | * | 10/2003 | Kudelka et al. ............ 438/689 |
| 2004/0197965 | A1 | * | 10/2004 | Birner et al. ............... 438/149 |

* cited by examiner

Primary Examiner—W. David Coleman
Assistant Examiner—Khiem Nguyen
(74) Attorney, Agent, or Firm—Daryl K. Neff; H. Daniel Schnurmann

(57) ABSTRACT

A method is provided for making a trench capacitor by forming a trench in a substrate. The trench is then widened and a sacrificial collar is formed on sidewalls of the widened trench. The trench is then vertically deepened to extend below the sidewalls of the sacrificial collar. Subsequently, a capacitor is formed in the trench below the sacrificial collar. An integrated circuit includes a deep trench structure formed in a single-crystal region of a semiconductor substrate including an upper trench portion, the upper trench portion having an opening of rectangular shape. A lower trench portion is formed below the upper trench portion. The lower portion may be widened to have a bottle shape. Alternatively, the upper trench portion may be widened relative to the lower trench portion.

10 Claims, 5 Drawing Sheets

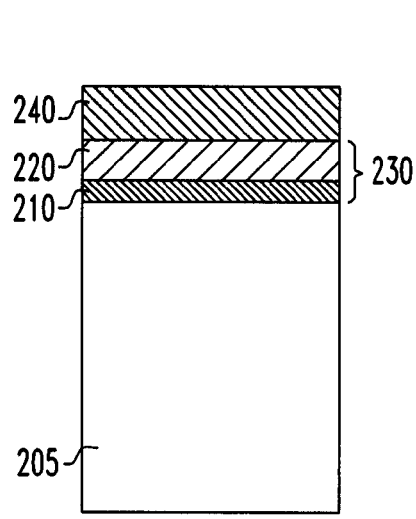
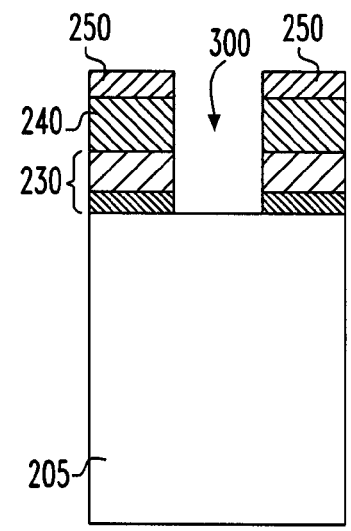
FIG. 2
FIG. 3
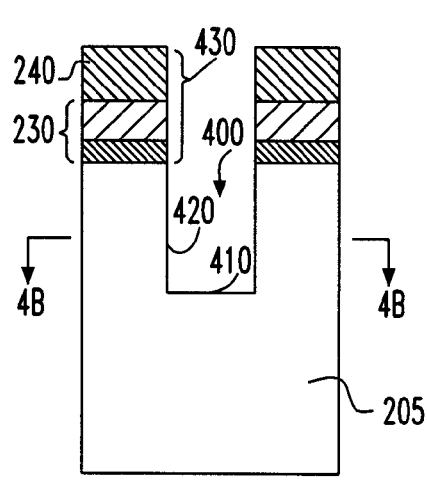
FIG. 4A
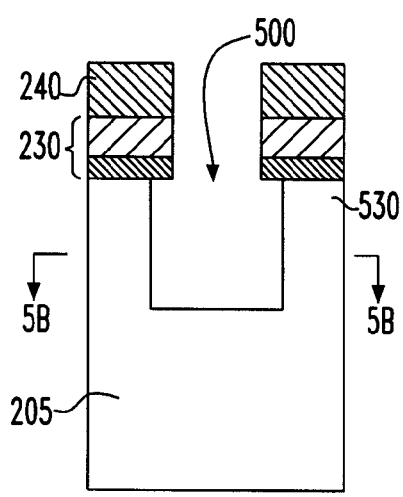
FIG. 5A
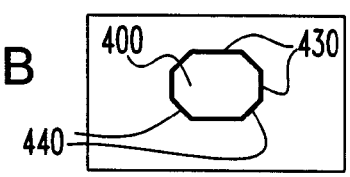
FIG. 4B
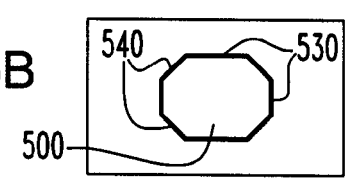
FIG. 5B

METHOD AND STRUCTURE FOR IMPROVED TRENCH PROCESSING

BACKGROUND OF INVENTION

The invention relates to a semiconductor processing method, and more particularly to an improved trench structure and method for processing a trench such as used as a storage capacitor of a dynamic random access memory.

The semiconductor industry's relentless drive to increase the circuit density of integrated circuits ("ICs" or "chips") demands that individual devices and circuit elements of a chip be reduced in size. In some dynamic random access memories (DRAMs), trench storage capacitors are used to store data bits. In those DRAMs which contain storage capacitors, the surface area of the chip occupied by the storage capacitor must be reduced with each new generation.

However, achieving such reduction in surface area is not straightforward. The different components of a trench storage capacitor scale unevenly. Some components such as the isolation collar formed in the trench above the storage capacitor cannot be reduced below a certain thickness such as 30 nm.

Trench capacitors are advantageously used in DRAMs because they allow capacitance to be increased without enlarging the surface area occupied by the memory cell. A trench capacitor is formed by etching a vertical structure into the silicon substrate. An increase in the capacitance can be achieved simply by etching a deeper trench, as opposed to "stacked" capacitors that require an increase in the area of the capacitor that occupies the main transistor-bearing surface of the chip. In addition, where planarity of a substrate is desired in processing a chip, trench capacitors are advantageous because their use does not affect the planarity of features on or above the substrate.

FIG. 1 is a cross-sectional view illustrating a prior art trench capacitor structure 10. The trench capacitor structure 10 is formed by a series of steps starting with etching a deep trench 111 into a single crystal region semiconductor substrate 100. The trench 111 includes a bottom 114 and sidewalls 116 and is separated into a lower portion 118 and an upper portion 119. The trench capacitor structure 10 is formed in the lower portion 118, while an isolation collar 160 is formed in the upper portion 119 to provide electrical isolation from nearby devices, such as transistors and other trench capacitors of the chip (not shown).

A buried plate 130 is typically formed in the single-crystal substrate 100 in the lower portion 118 of the trench as the first electrode of the trench capacitor 10. The buried plate 130 is typically formed by out-diffusion of n$^+$ dopants from a dopant source inside the trench 111 into a region of the substrate 100 which surrounds the lower portion 118. For example, an n$^+$ doped glass, such as arsenic-doped silicate glass (ASG), can serve as the dopant source if deposited onto the sidewalls 116 and bottom 114 of the lower portion 118. This would be done after the isolation collar 160 is in place in the upper portion 119. The dopant source is then driven into the lower portion 118 by an annealing process at high temperature. Alternatively, gas phase doping (GPD) could be used, also after the isolation collar 160 is in place.

A capacitor dielectric layer 140 is then formed on the sidewalls of the trench 111. Thereafter, a conductive fill 120, such as n$^+$ doped polycrystalline silicon (herein after "polysilicon" or "poly") is deposited to fill the lower portion 118 of the trench 111 as a second capacitor electrode.

A buried well region is shown at 170. The buried well 170 serves to provide a connection between buried plates 130 of respective trench storage capacitor of a DRAM array in which the DRAM cell is located.

In some prior art methods, the trench 111 is etched into the semiconductor substrate with the aid of a pad stack 180 which includes a pad oxide layer 182 over which a pad nitride layer 184, also known as a pad stop layer is provided. The pad nitride layer 184 can be superposed with a hard mask layer 190, typically including a layer of deposited oxide.

In some other prior art methods, the final isolation collar is formed prior to subsequent processing steps which form the trench capacitor. The presence of some kind of collar in the upper part of a deep trench is imperative both for forming the buried plate and for the enhancement of node capacitance. The collar acts as a hardmask to block the outdiffusion of a dopant into the sidewalls of the upper part of the trench. The collar also prevents the silicon in the upper part of the trench from being etched.

However, as ever narrower trenches are required to reduce the chip surface area of a DRAM cell, particular challenges are presented. Narrower trench capacitors have smaller trench openings at the chip surface. Since the fabrication of a trench capacitor requires successive steps of deposition and etching of material layers through the trench opening, a narrow trench can become clogged, a condition commonly referred to as "pinchoff". In pinchoff, the opening of the trench may close up entirely or otherwise leave insufficient space for the deposition and etching steps are performed inside the trench.

This problem is particularly exacerbated by the thickness of the collar. In fact, in processing trenches at an exemplary width today (90 nm), formation of the final isolation collar prior to formation of the trench capacitor is no longer possible. This is because the final collar typically has a thickness of 30 nm on each sidewall of the trench. Given that the collar is formed on both sidewalls of the trench, in a 90 nm wide etched opening, the collar would leave an opening of only 30 nm through which all subsequent processing would need to be performed.

More recent approaches are focused on use of a thinner, i.e. significantly thinner than 30 nm, sacrificial collar to protect the upper portion of the trench during processing to form the trench capacitor. After such processing, the sacrificial collar is removed and later replaced with the final isolation collar.

In the prior art, there are two main classes of methods of trench processing that utilize a sacrificial collar in the upper part of a deep trench. In the first class, the deep trench is formed by a one-step process, preferably by reactive ion etching (RIE). A sacrificial collar is formed after etching the deep trench. Three common processes in this class are briefly described as follows, along with their inherent limitations.

These three processes are the anti-collar scheme, the sacrificial polysilicon scheme and the modified anti-collar scheme. In the anti-collar scheme, an oxide layer is first formed on the sidewalls of the trench. The trench is then filled with resist, and the top surface of the resist is recessed to a predetermined depth below the top of the trench. Thereafter, the oxide is removed from the upper portion of the trench. Then, the resist in the lower portion of the trench is stripped. This leaves only the bottom portion of the trench sidewalls covered by oxide. Next, the wafer is exposed to a nitrogen-containing atmosphere, such as NH$_3$. By this step, a thin layer of nitride is thermally grown on the trench sidewalls only in the upper portion of the trench. The oxide in the lower portion prevents the nitride from being grown there. Thereafter, the oxide is removed from the sidewalls in the lower portion of the trench, leaving the nitride collar in the upper portion only.

An inherent limitation of the anti-collar scheme is that the maximum thickness of nitride that can be grown thermally is limited to about 25 Å. A layer having such thickness is not sufficient to act as a collar for subsequent processing.

The second method, the sacrificial polysilicon scheme, begins with the formation of a first oxide layer on the trench sidewalls, typically by thermal oxidation. A first nitride layer is then formed on the trench sidewalls by low pressure chemical vapor deposition (LPCVD). The trench is thereafter filled with polysilicon, and the top surface of the polysilicon is recessed to a predetermined depth below the top of the trench. Using in-situ steam growth (ISSG), the polysilicon and nitride surfaces are oxidized, and then a second layer of nitride is deposited by LPCVD. Anisotropic etch by reactive ion etching (RIE) is then used to remove the nitride and ISSG oxide on the polysilicon, while leaving the nitride and ISSG oxide on the sidewalls of the trench. An aggressive etch follows, in order to remove all of the polysilicon in the trench bottom portion.

The first nitride layer in the lower trench portion is then stripped, stopping on the first oxide layer. Simultaneously, the second nitride layer in the upper trench portion is stripped. The first oxide layer in the lower trench portion and ISSG oxide on the upper trench portion are then stripped, leaving a collar formed in the upper trench portion only. The resulting collar includes a thin layer of oxide and a layer of nitride.

Unlike the anti-collar scheme in which the nitride collar is formed by thermal growth, the nitride in the sacrificial polysilicon scheme is formed by LPCVD. Therefore, the nitride in the sacrificial polysilicon scheme may be of any thickness. This scheme, however, suffers from the following disadvantages: process complexity, and severe defect generation during polysilicon removal from the lower trench portion. The removal process must be very aggressive in order to completely remove the polysilicon. This may cause severe defect issues such as pinholes on the trench sidewall and damage to some surface features of the substrate such as alignment marks.

In the third process, the modified anti-collar scheme, a first oxide layer is formed on the trench sidewalls by thermal growth. Thereafter, a first nitride layer is formed on the first oxide layer by LPCVD. Then, a second oxide layer is formed on the nitride layer. Thereafter, a thin layer of polysilicon is deposited on the second oxide layer, and then the surface of the polysilicon is oxidized to form a third oxide layer. In such manner, a stack of three oxide layers and one nitride layer are formed on the sidewalls of the trench. The trench is then filled with resist, and the top surface of the resist is recessed to a pre-determined depth below the top of the trench. The third oxide layer is then removed from the exposed top portion of the trench sidewall, and then the resist is stripped. A second nitride layer is formed on the upper trench portion only by thermal nitridation. The bottom portion of the trench is covered by the third oxide, thereby inhibiting nitride growth on the lower trench portion. The third oxide is then stripped from the trench bottom portion, using a removal process which is selective to the second nitride layer. The polysilicon is then stripped from the lower trench portion, using a removal process which is selective to the second nitride layer. The first nitride layer is then stripped from the lower trench portion, stopping on the first oxide layer. Simultaneously, the second nitride layer on the upper trench portion is stripped, stopping on the polysilicon layer. The polysilicon layer is then stripped from the upper trench portion. The first oxide layer is then stripped from the lower trench portion. Simultaneously, the second oxide layer on the upper trench portion is stripped. A collar is thereby formed on in the upper trench portion only. Similar to the sacrificial polysilicon scheme, the collar includes a thin layer of oxide and a layer of nitride.

An advantage of the modified anti-collar scheme is that it avoids the aggressive polysilicon removal step. However, its disadvantages include: process complexity, poor collar quality in which the sacrificial collar can have "pinholes" due to the conditions in which the thin films are deposited. The multiple layers of film deposition may cause a high defect density in the sacrificial nitride collar. This process is also subject to the possibility of pinch-off in narrow trenches.

U.S. Pat. No. 5,482,883 describes a process in which a trench is formed by a two-step etch. As described in that patent, a trench is etched to a predetermined depth. A collar is then formed on the trench sidewall, and then a second etch is performed to reach the final depth of the deep trench. A problem of that process is collar integrity. In that process, it appears difficult to form a collar having good integrity because the collar is exposed to and damaged by ions and plasma during the second etch.

Consequently, an improved method of trench fabrication is needed using a sacrificial collar structure that avoids the problems of the prior art methods currently being practiced. The present invention provides such an improved method.

In addition to the above-described challenges of fabricating trench capacitors, the structure of the deep trench itself poses challenges to the achievement of desirable DRAM cell. For the vertical transistor in the upper portion of the trench to have good performance, it would be desirable for the deep trench to have a rectangular shaped cross-section, when viewed from top down looking into the trench.

However, resolution limits make that goal difficult to achieve by photolithography. Trenches having minimum width, i.e. width at the minimum lithographic feature size F, for example 90 nm, cannot be patterned lithographically and etched by conventional methods to provide a rectangular shaped cross-section. Instead, resolution limits cause trenches at that feature size to be patterned and etched in a somewhat octagonal shape. The octagonal shape is undesirable because it presents a set of three angled trench sidewalls to the active area at the main surface of the semiconductor substrate. Variations in the electric field at vertices between the trench sidewalls decrease performance of a transistor formed vertically along those sidewalls.

In view of the foregoing, it would be desirable to provide a two-step deep trench etch process in which a sacrificial collar is formed after the first etch step. In such manner, the sacrificial collar desirably retains satisfactory integrity during and after the second deep etch step.

It would further be desirable, in a two-step deep trench etch process, to widen the upper portion of a trench after a first trench etch step, prior to forming a sacrificial collar on the upper portion of the trench.

It would further be desirable, in a two-step deep trench etch process, to widen the upper portion of the trench in a semiconductor substrate selectively to one or more overlying layers serving as a mask for the second deep etch step. In such manner, an overhang would be desirably disposed over the sidewalls of the upper portion of the trench. Moreover, a sacrificial collar formed in the upper portion is desirably protected by the overhang from damage during the second, deep etch step.

It may further be desirable, in a two-step deep trench etch process, to widen the upper portion of the trench in a semiconductor substrate in an anisotropic manner to reshape the trench to a rectangular form. In such manner, the trench desirably presents a single planar surface to an active area at a main surface of the semiconductor substrate.

SUMMARY OF INVENTION

According to an aspect of the invention, a method is provided for making a trench capacitor by forming a trench in a substrate. The trench is then widened and a sacrificial collar is formed on sidewalls of the widened trench. The trench is then vertically deepened to extend below the sidewalls of the sacrificial collar. Subsequently, a capacitor is formed in the trench below the sacrificial collar.

According to another aspect of the invention, an integrated circuit is provided including a deep trench structure formed in a single-crystal region of a semiconductor substrate. The deep trench structure includes an upper trench portion formed in the single-crystal region, the upper trench portion having an opening which has been widened by either isotropic or anisotropic means. The upper trench is preferably widened to have a cross-sectional rectangular profile. The deep trench structure further includes a lower trench portion formed in the single-crystal region below the upper trench portion, wherein the upper trench portion is widened relative to the lower trench portion.

BRIEF DESCRIPTION OF DRAWINGS

FIGS. 2 through 11 are cross-sectional views illustrating stages in a trench capacitor fabrication process according to various embodiments of the invention.

DETAILED DESCRIPTION

Figure 1:
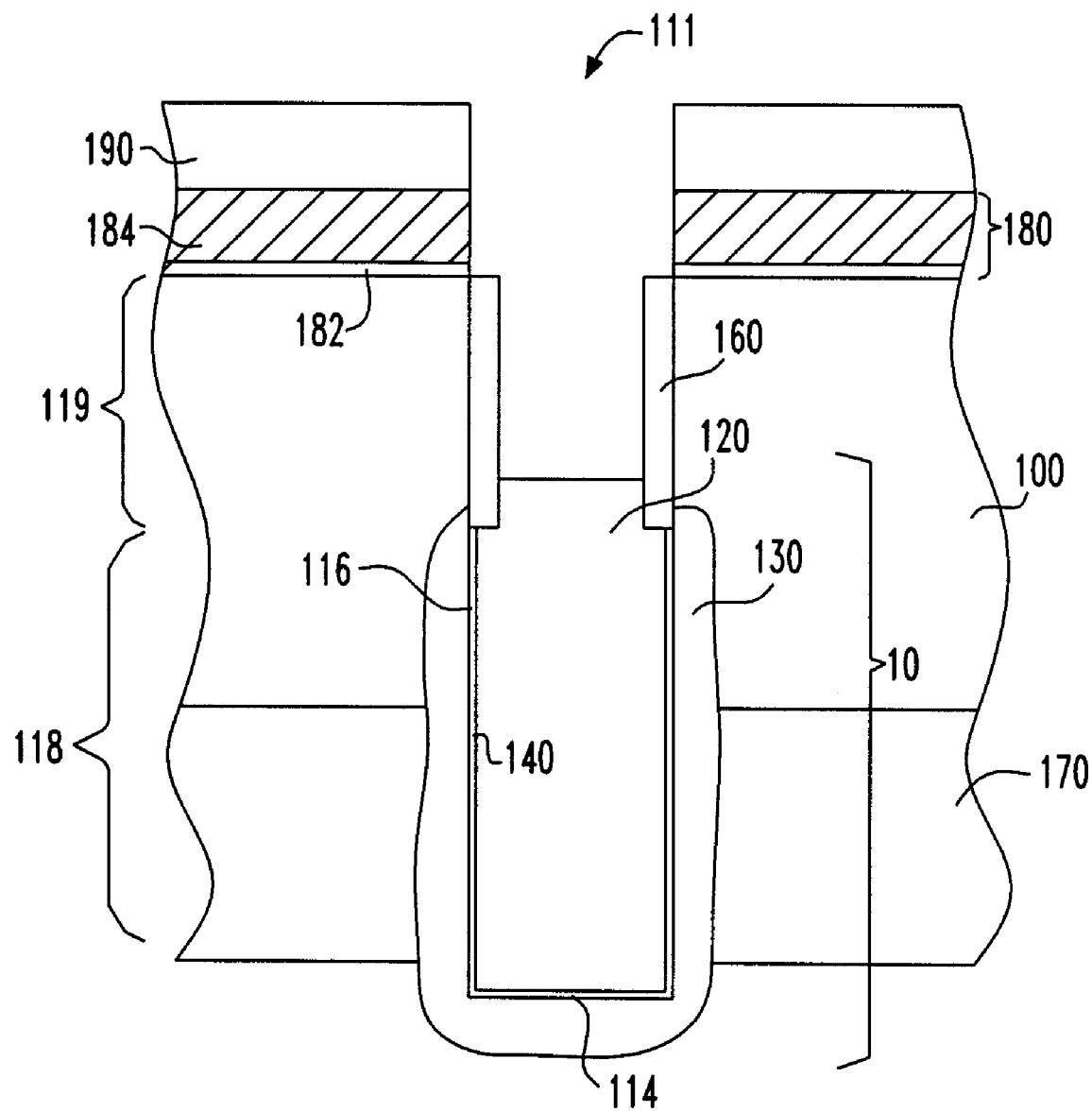
FIG. 1 is a cross-sectional view illustrating a stage in the fabrication of a trench capacitor according to a prior art method.

The invention provides a new processing method which addresses the above-described problems in the fabrication of trench capacitors. Through a combination of fabrication steps including a two-step deep trench etch and pull-back in the upper portion of the trench, the present invention resolves many of the problems present in the prior art. Pull-back permits the formation of a sacrificial collar which does not narrow the trench opening so as to interfere with critical steps in making the trench capacitor. Accordingly, buried plate processing and other capacitor processing can be performed without concerns regarding pinchoff of the trench opening.

In the two-step trench etch process of the invention, a relatively narrow trench is first formed, as by etching into the substrate. Then, sidewalls of the trench are pulled back. Later, a sacrificial collar is formed on the sidewalls. Thereafter, the trench is then etched to a final depth.

A variety of methods may be utilized to form the deep trench. Some methods involve the patterning of a mask layer of a material less susceptible to etching, such a hard mask layer of silicon dioxide or silicon nitride. Thereafter, the substrate is placed within a process chamber and etched by an anisotropic vertical etch process such as a reactive ion etch (RIE). Thereafter, the remaining hardmask layer is removed as by isotropic or other etching.

FIGS. 2 through 11 illustrate stages in processing according to various embodiments of the invention. FIG. 2 illustrates a first stage of processing. As shown in FIG. 2, a pad stack 230 is deposited on top of a substrate 205. The pad stack 230 can be comprised of different layers such as a pad nitride layer 220 and a pad oxide layer 210. A hard mask 240 is disposed over the pad stack 230. The hard mask 240 is provided to protect areas of the substrate during subsequent etching and other processes, as will be discussed in more detail later. An example of a hard mask 240 may be a tetraethylorthosilicate (TEOS) deposited glass layer. An oxide layer such as borosilicate glass (BSG) may also be utilized as the hard mask 240.

As shown in FIG. 3, a photoresist layer 250 is then deposited and patterned. The hardmask layer 240 and pad stack 230 are then anisotropically etched according to the patterned resist layer to define areas that are selected for trench formation. FIG. 3 shows an opening 300 in which the hardmask layer 240 and the underlying pad stack layer 230 have been selectively patterned. In an embodiment of the invention, the opening 300 is formed by an anisotropic etch such as a reactive ion etch (RIE), although other methods such as chemical dry etching, ion milling or other methods could also be used. An alternative patterning process with better selectivity may include a second hardmask (not shown) between the photoresist layer 250 and the first hardmask 240. The patterning is first transferred to the second hardmask from the photoresist. The second hardmask is used to pattern the first hardmask layer 240. Photoresist and the second hardmask may be optionally removed, respectively, before and after the first hardmask is etched.

FIGS. 4A and 4B illustrate the next processing stage in which a trench 400 is etched into the semiconductor substrate 205, preferably by an anisotropic vertical RIE. FIG. 4A is a cross-sectional view of the trench 400 and FIG. 4B is a plan view of the trench 400 through lines 4B—4B. After etching the trench 400, a bottom 410 and sidewalls 420 are defined thereby. In FIG. 4A, the trench 400 is created in such a manner so that the edge of the pad stack 230 and the hardmask layer 240 are aligned with the sidewalls 420 of the trench 400. In an alternative embodiment of the present invention, the trench can be intentionally tapered to facilitate polysilicon fill during later processing, e.g. for node electrode formation. FIG. 4B illustrates the shape of the trench opening when viewed from top down. The trench 400 has somewhat octagonal shape, this being a typical shape of the trench after RIE, the shape having been limited by the resolution of the photolithography system as well as the crystallographic dependence of RIE. The octagonal shape includes four sidewalls 430 lying in a first set of planes having the crystallographic orientation <110>, and four other sidewalls 440 lying in a second set of planes having the crystallographic orientation <100>.

Figure 11:
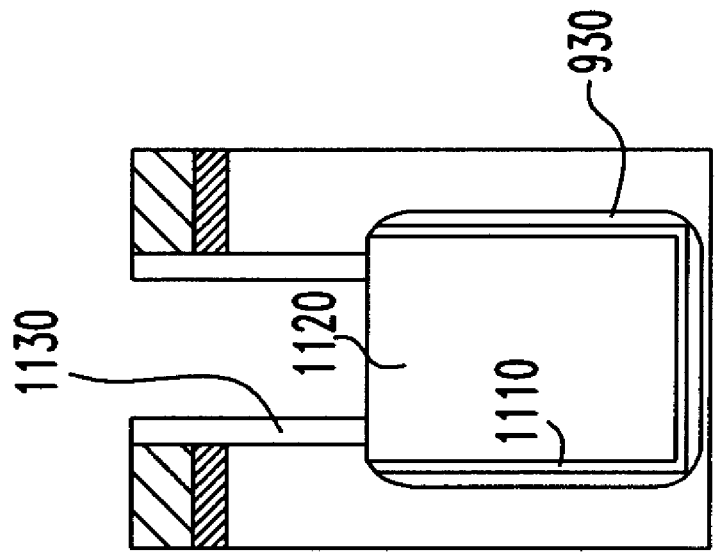

Referring to FIGS. 5A and 5B, the sidewalls 420 of the trench 400 are "pulled back" to form a widened trench 500. In an embodiment, this is performed using an isotropic wet etch such as a $HNO_3/HF$ mixture or a dry plasma etch selective to the materials of the pad stack 230 and the hardmask layer 240. Inside the trench, the isotropic etch proceeds uniformly in all directions such that the widened trench 500 retains the octagonal shape, having four sidewalls 530 oriented in crystallographic planes <110> and four other sidewalls 540 oriented in crystallographic planes <100>. Any sputtered residue remaining from the prior RIE etch of trench 400 is removed from the sidewalls 420 by this isotropic etch. In an embodiment, the trench 400 is widened selective to the materials of the pad stack 230 and the hardmask 240 so that the hardmask 240 and pad stack 230 thereafter overhangs the sidewalls of the widened trench 500. The sacrificial collar formed thereafter is then less subject to plasma attack during the subsequent vertical RIE etch (FIG. 7) used to deepen the trench 500 because it is then protected from the vertical RIE by the overhang. The sacrificial collar will also be less susceptible to being broken or damaged during that etch. Preserving the sacrificial collar during that etch is important. A damaged sacrificial collar could lead to misalignment of the buried plate (FIG. 9) and inadequate isolation of the final collar 1130 (FIG. 11).

Figure 5C:
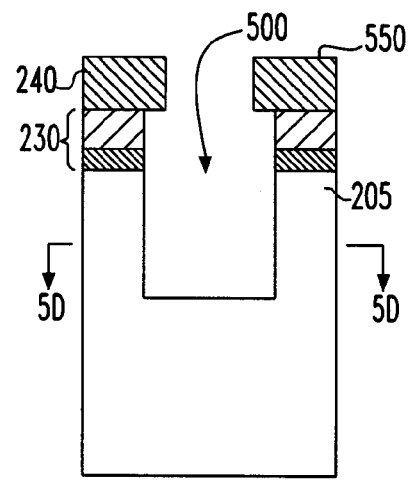
Figure 5D:
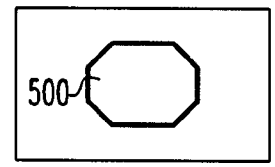

Another embodiment is illustrated in the cross-sectional view of FIG. 5C and the corresponding plan view of FIG. 5D. In this embodiment, etching is performed to pull back the sidewalls of the trench opening in the pad stack 230 as well. Preferably, the pad oxide 210 and pad nitride 220 layers of the pad stack 230 are pulled back by an etch process separate from and performed after the etch used to widen the trench 500 in the semiconductor substrate. As a result, the hardmask 240 now overhangs the sidewalls of the widened trench 500 formed in both the pad stack 230 and the substrate 205 below. The overhanging hardmask 240 now better protects the pad stack 230 from plasma damage during the subsequent vertical RIE. In addition, the widened trench opening is brought closer to the upper surface 550 of the hardmask 240, widening the process window for subsequent deposition and etch processes performed through the trench opening.

The widened trench opening addresses the pinchoff problems of the prior art methods. The widened trench opening makes the trench less subject to clogging and pinchoff during the many required processes including depositions and etches that are performed subsequent thereto. The pull-back process, however, has to be carefully controlled such that the widened trenches do not become so close as to permit unwanted interaction with other trenches or other nearby functional IC components.

Figure 5E:
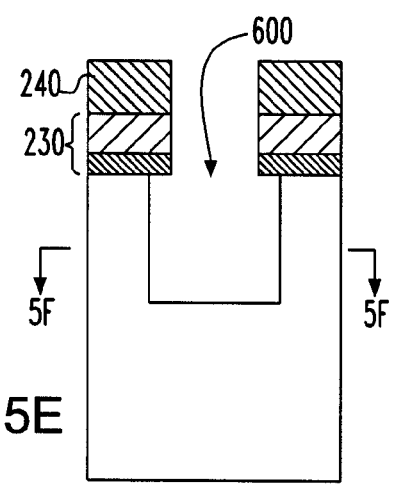
Figure 5G:
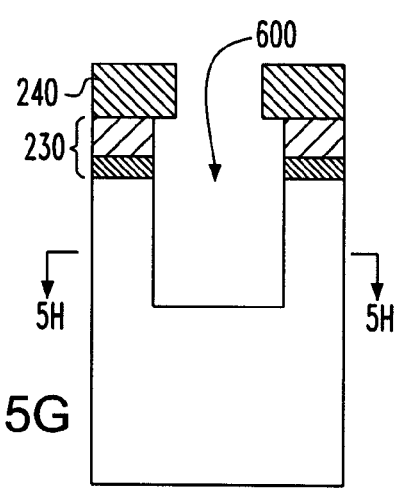
Figure 5F:
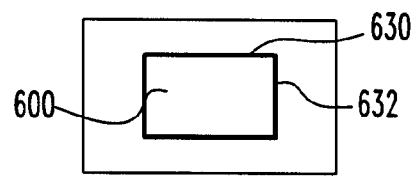
Figure 5H:
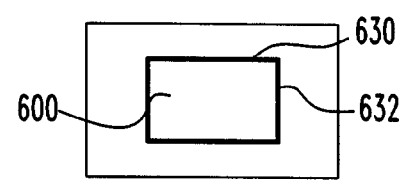

FIG. 5E is a cross-sectional view and FIG. 5F is a plan view illustrating an alternative embodiment in which the pull-back etch results in the widened trench 600 becoming rectangular in shape. An anisotropic wet etch process of a selective crystallographic nature, with an alkaline chemistry such as NH$_4$OH is used to widen the trench to rectangular shape. Referring again to FIG. 4B, such anisotropic etch is possible because of the different crystallographic orientations of the sidewalls 430 and 440 of the originally formed trench 400. The anisotropic etch proceeds faster on the sidewalls 440 that lie in the crystallographic planes <100> than the sidewalls 430 that lie in the crystallographic planes <110>, resulting in the rectangular shape of the widened trench 600. Any sputtered residue remaining from the prior RIE etch of trench 400 is removed from the sidewalls 420 by this isotropic etch.

It is preferred for at least the upper portion of the trench 600 to have rectangular shape rather than octagonal shape for the following reason. Desirably, a vertical transistor DRAM cell will be subsequently fabricated from the trench 600. When the DRAM cell is completed, the active area of the semiconductor substrate adjoins the sidewalls of the trench 600. It is desirable for the trench 600 to present a single planar surface 630 to the active area on each side of the trench 600. This is possible when the trench 600 has rectangular shape. When the trench 500 does not have rectangular shape, but octagonal shape instead, the trench 500 presents multiple planar surfaces 530, 540 to the active area.

In the embodiment shown in FIGS. 5E and 5F the anisotropic etch is performed selective to the materials of the pad stack 230 and the hardmask 240 such that the hardmask 240 and the pad stack 230 overhang the sidewalls 630 and 632 of the widened trench 600. In an alternative embodiment shown in FIGS. 5G and 5H, etching is performed to pull back the sidewalls of the trench opening in the pad stack 230 as well. Preferably, the pad oxide 210 and pad nitride 220 layers of the pad stack 230 are pulled back by an etch process separate from and performed after the etch process used to widen the trench 600 in the semiconductor substrate.

Figure 6:
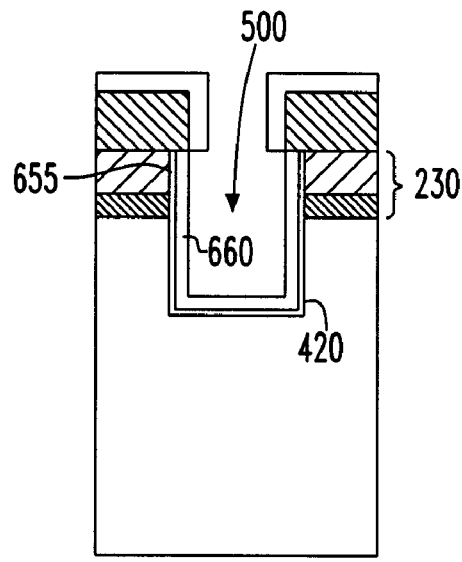

FIG. 6 illustrates the next stage of processing, the formation of a sacrificial collar. In an embodiment the sacrificial collar is formed only on the sidewalls and bottom of the trench, as by a limited process of local oxidation of silicon (LOCOS) to form a sacrificial collar 160 that is preferably thinner than the final collar and which is thereafter removable. In another embodiment, as shown in FIG. 6, the sacrificial collar is deposited onto the sidewalls 420 and bottom of the trench, the pad stack 230 and the hard mask 240. Collar formation by deposition is preferred, particularly when the trench 600 is rectangular in shape. Deposition creates a somewhat thicker collar in the corners of the trench 600 and thereby results in less stress across the deposited collar film than would be the case with a thermally grown film.

In an embodiment, the sacrificial collar can comprise a nitride layer 660 formed directly on the sidewalls 420 of the trench 500. Alternatively, an underlying oxide layer 655 can be formed on the trench sidewalls, over which an overlaying nitride layer 660 is then formed. The oxide layer may be formed by thermal growth or deposition. The thickness of the layer or layers comprising the sacrificial collar should preferably be kept sufficiently thin without impacting the intended the function of the collar. The deposition of the nitride layer 660 can be accomplished in a variety of ways such as LPCVD (low pressure chemical vapor deposition), PECVD (plasma enhanced CVD), atomic layer deposition (ALD), or other similar methods. Most preferably, low pressure chemical vapor deposition (LPCVD) is used to deposit one or more relatively thin, high quality films.

Figure 7:
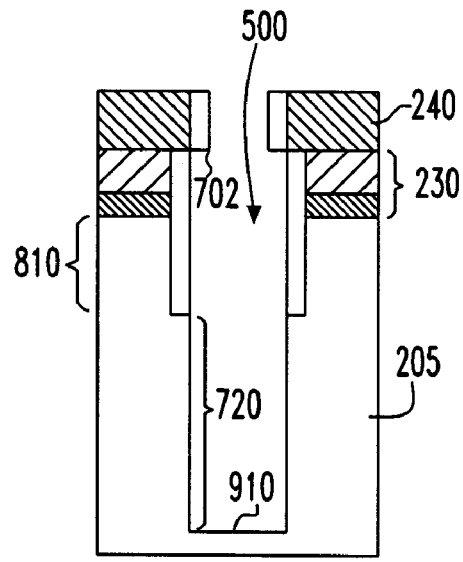
Figure 8:
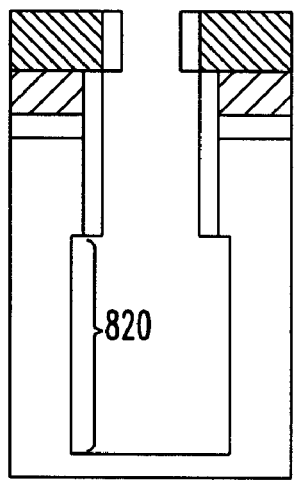

As shown in FIG. 7, after the sacrificial collar is formed, the trench 500 is deepened. In an embodiment of the invention, deepening is performed using an anisotropic etch such as RIE. In such process, the trench 500 is etched deeply into the substrate to create a new bottom 910 and a lower portion 720 having sidewalls that extend below the original sidewalls (shown at 420 in FIG. 6) on which the sacrificial collar is disposed. The sacrificial collar remains in place on the upper sidewalls of the trench to protect the upper portion 810 of the trench from subsequent processes. During the etching process such as RIE which uses directed ion beams, the sacrificial collar is protected from attack by the fact that it lies underneath an overhanging portion 702 of the hardmask layer 240 and of the pad stack 230. As a result, following the etch, the sacrificial collar remains an unbroken, usable layer for protecting the upper portion of the trench when the buried plate is thereafter formed in the lower portion of the trench FIG. 8 illustrates an alternative embodiment in which an alternative trench structure is proposed. In this embodiment, the lower portion 820 of the trench is widened to an extent wider than the upper sidewall area where the sacrificial collar is located. The widened lower portion 820 increases its surface area and therefore, increases the capacitance of the trench capacitor. The particular embodiment shown in FIG. 8 has a shape similar to a bottle, although other similar configurations can be achievable. It should be noted that wet etching as well as dry etching can be performed to enlarge the lower portion 820.

The further bottle processing of the trench is optional. It is used when enhanced capacitance is desired and it can be performed without impacting operability.

Figure 9:
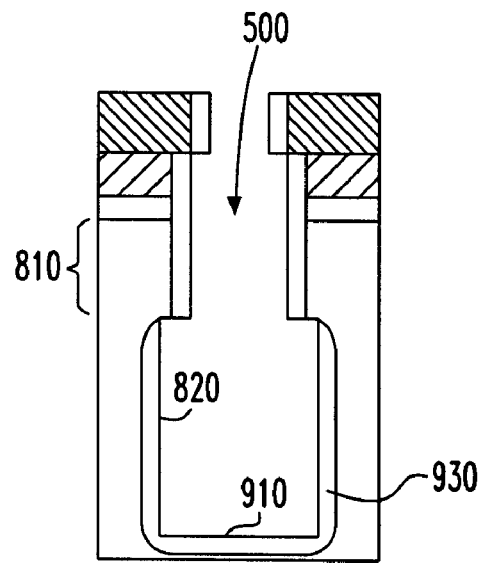

FIG. 9 illustrates a stage in the formation of capacitor structure in the lower portion 820 of the trench 400. The process starts with the formation of a buried plate 930 as depicted in FIG. 9. A variety of techniques can be utilized to form the buried plate. A dopant can be driven into the area of the substrate surrounding the trench to form the buried plate. The dopant implantation may be conducted by gas phase doping (GPD), ASG technique, plasma doping, plasma immersion ion implantation, or any combination of these approaches known in the prior art. The dopant may comprise n-type dopants such as arsenic and phosphorous, or p-type dopants such as boron or other dopants, as examples. Typically, the buried plate is doped using an n-type dopant.

One of the advantages of the present invention is that when any technique is used to form the buried plate, dopant penetration in the upper trench is suppressed. This is due to the improved integrity of the sacrificial collar according to the embodiments of the invention. The creation of a protective overhang of the hardmask and/or pad stack over the sacrificial collar protects the sacrificial collar from damage during subsequent processing including etching to the final depth of the trench.

Figure 10:
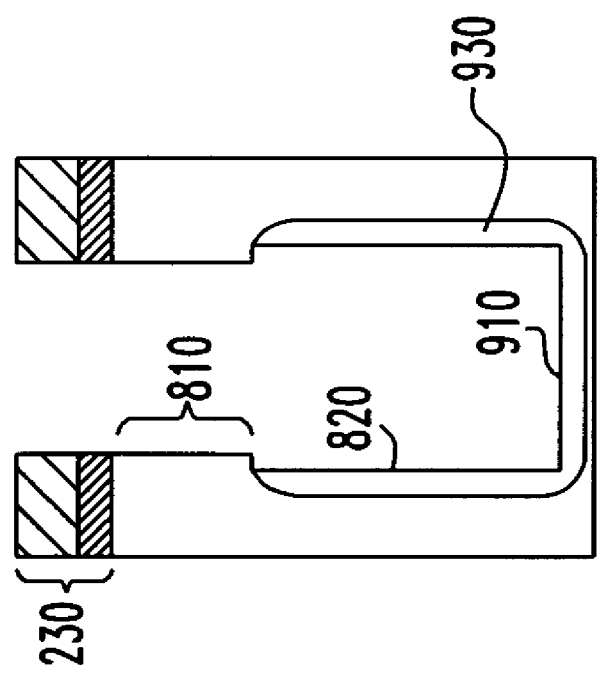

After the buried plate process has been performed, the hard mask layer 240 may be then removed as shown in FIG. 10. The removal of the hard mask layer can be accomplished at this stage because no further etching is to be conducted. Alternatively, the hard mask layer may be removed in the subsequent process.

In an embodiment of the invention, when the hard mask 240 is removed, the sacrificial collar is also removed. In an embodiment of the invention, as shown in FIG. 6, in which an optional oxide layer 655 is formed, followed by a nitride layer 660 to form the sacrificial collar, the nitride layer is removed first using a nitride etch selective to the silicon and/or oxide. This procedure removes the nitride layer 660 and exposes the optional underlying oxide layer 655, if present. After this procedure is conducted, if the optional underlying oxide layer is present, a second oxide etch selective to the silicon is performed to remove that oxide layer from the upper portion of the trench 810 and any other locations where the oxide layer 655 is formed. FIG. 10 illustrates a stage after the removal of the nitride/oxide layer(s) as per one embodiment of the present invention. The trench is now ready for further processing to complete the trench capacitor. In an alternative embodiment (not shown), the sacrificial collar is removed after rather than before the trench capacitor is formed.

To complete the fabrication process of the trench capacitor, a dielectric layer including a material such as $SiO_2$, $Si_3N_4$, SiON, $HfO_2$, or other dielectric material, is formed on the bottom and sidewalls of the trench. Thereafter, the trench is filled with a conductive fill, such as heavily doped polysilicon or metals, and recessed to a desired level to form the node electrode of the trench capacitor. An isolation collar is then formed on upper sidewalls of the trench, as by LOCOS, or alternatively by depositing one or more layers of materials such as an oxide (e.g. silicon dioxide), a nitride (e.g. silicon nitride), or a combination of the two.

The process of the present invention is simplified relative to the prior art. The pull-back methodology in conjunction with two-stage trench etch processing of the invention, while being easy to implement, addresses a range of problems from trench clogging and pinchoff to collar integrity that exist in the prior art.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of providing a trench capacitor on a semiconductor substrate, comprising:

forming a pad stack including a first material on a semiconductor substrate;

forming a hard mask including a second material over said pad stack, wherein said first material is etch distinguishable from said second material;

patterning said hard mask and said pad stack to form aligned openings in said hard mask and said pad stack extending from a top surface of said hard mask to a top surface of said semiconductor substrate;

vertically etching said semiconductor substrate through said aligned openings to form a trench;

horizontally widening sidewalls of said trench by a first etch process to form a widened trench having widened sidewalls extending from said top surface of said semiconductor substrate;

widening sidewalls of said opening in said pad stack by a second etch process having etch selectivity to said second material to form a widened opening in said pad stack relative to said opening in said hard mask such that said hard mask overhangs said widened sidewalls of said widened opening in said pad stack and overhangs said widened sidewalls of said widened trench;

forming a sacrificial collar on said widened sidewalls of said widened trench;

vertically deepening said trench to create a lower portion extending below said sacrificial collar; and forming a capacitor in said lower portion.

2. The method of claim 1 wherein said trench is formed by anisotropic etching.

3. The method of claim 1 wherein said widened trench is widened by isotropic etching using a chemistry including an $HNO_3$/HF mixture.

4. The method of claim 1 wherein said widened trench is widened by anisotropic etching using a chemistry selected from the group consisting of wet alkaline chemistry and $NH_4OH$.

5. The method of claim 1 wherein said trench is deepened by anisotropic etching.

6. The method of claim 1 wherein said pad stack comprises a pad nitride layer overlying a pad stop layer including an oxide.

7. The method of claim 1 wherein said second material is an oxide layer selected from the group consisting of a tetraethylorthosilicate (TEOS) deposited oxide layer and a borosilicate glass (BSG) deposited oxide layer.

8. The method of claim 1 wherein said sacrificial collar comprises a layer of nitride.

9. The method of claim 8 wherein said sacrificial collar further comprises a layer of oxide below said layer of nitride, said layer of oxide contacting said widened sidewalls of said widened trench.

10. The method of claim 1 further comprising widening said lower portion by an isotropic etch to achieve a bottle-shaped structure prior to forming said capacitor.

* * * * *